United States Patent
Zhao et al.

(10) Patent No.: US 11,991,933 B2
(45) Date of Patent: May 21, 2024

(54) MAGNETIC RANDOM-ACCESS MEMORY

(71) Applicant: BEIHANG UNIVERSITY, Beijing (CN)

(72) Inventors: Weisheng Zhao, Beijing (CN); Daoqian Zhu, Beijing (CN); Zongxia Guo, Beijing (CN); Kaihua Cao, Beijing (CN); Shouzhong Peng, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 0 days.

(21) Appl. No.: 17/161,317

(22) Filed: Jan. 28, 2021

(65) Prior Publication Data

US 2022/0102622 A1    Mar. 31, 2022

(30) Foreign Application Priority Data

Sep. 30, 2020    (CN) .......................... 202011059916.6

(51) Int. Cl.
*H10N 52/00*    (2023.01)
*H10B 61/00*    (2023.01)
*H10N 50/85*    (2023.01)
*H10N 52/80*    (2023.01)

(52) U.S. Cl.
CPC ............. *H10N 52/80* (2023.02); *H10B 61/00* (2023.02); *H10N 50/85* (2023.02); *H10N 52/00* (2023.02)

(58) Field of Classification Search
CPC ................................ H01L 43/04; H10N 52/00
See application file for complete search history.

(56) References Cited

U.S. PATENT DOCUMENTS 9,953,692 B1    4/2018 Mihajlovic et al.
2020/0006643 A1*  1/2020 Gosavi ................. H01L 27/228
2021/0383850 A1* 12/2021 Amiri .................. G11C 11/1673
(Continued)

OTHER PUBLICATIONS

H. Honjo et al., First demonstration of field-free SOT-MRAM with 0.35 ns write speed and 70 thermal stability under 400° C. thermal tolerance by canted SOT structure and its advanced patterning/SOT channel technology, IEEE IEDM 19, pp. 657-660, 2019.
(Continued)

*Primary Examiner* — Moazzam Hossain
*Assistant Examiner* — Hajar Kolahdouzan
(74) *Attorney, Agent, or Firm* — Westbridge IP LLC

(57) ABSTRACT

The present disclosure provides a magnetic random-access memory, comprising: an antiferromagnetic layer; a magnetic tunnel junction disposed on the antiferromagnetic layer and comprising a ferromagnetic layer disposed corresponding to the antiferromagnetic layer; wherein the ferromagnetic layer of the magnetic tunnel junction has in-plane magnetic anisotropy, and an exchange bias field is formed between the antiferromagnetic layer and the ferromagnetic layer by an annealing process. A direction of the exchange bias field is changed by a spin orbit torque, thereby changing a direction of a magnetic moment of the ferromagnetic layer and realizing data writing. The present disclosure can improve a thermal stability of the i-MTJ and reduce a lateral dimension of the i-MTJ, thereby improving a storage density of the magnetic memory.

6 Claims, 9 Drawing Sheets

(56) References Cited

U.S. PATENT DOCUMENTS

2022/0068339 A1* 3/2022 Dieny .................. H10B 61/00

OTHER PUBLICATIONS

H. Kim et al., Field-free control of exchange bias by spin Hall currents, Appl. Phys. Lett. 115, 022401, Jul. 8, 2019.
K. Garello et al., Manufacturable 300mm platform solution for Field-Free Switching SOT-MRAM, IEEE VLSI, 2019.
M. Wang et al., Field-free switching of a perpendicular magnetic tunnel junction through the interplay of spin-orbit and spin-transfer torques, Nature Electronics, vol. 1, pp. 582-588, Nov. 2018.
P. Lin et al., Manipulating exchange bias by spin-orbit torque, Nature Materials, vol. 18, pp. 335-341, Apr. 2019.
R. Ramaswamy et al., Recent advances in spin-orbit torques: Moving towards device applications, Appl. Phys. Rev. 5, 031107, Sep. 5, 2018.
S. Fukami et al., A spin-orbit torque switching scheme with collinear magnetic easy axis and current configuration, Nature Nanotechnology vol. 11, pp. 621-625, Mar. 21, 2016.
S. Fukami et al., Magnetization switching by spin-orbit torque in an antiferromagnet-ferromagnet bilayer system, Nature Materials, vol. 15, pp. 535-541, Feb. 15, 2016.

\* cited by examiner

MAGNETIC RANDOM-ACCESS MEMORY

CROSS REFERENCE TO RELATED APPLICATIONS

This application claims priority to Chinese Application Number 202011059916.6, filed on Sep. 30, 2020, the subject matter of which is incorporated herein by reference.

TECHNICAL FIELD

The present disclosure relates to the field of magnetic random-access storage technologies, and in particular to a magnetic random-access memory.

BACKGROUND ART

The Spin-Orbit Torque Magnetic Random Access Memory (SOT-MRAM) has the advantages such as non-volatility, data writing of a high speed and a low power consumption (the writing speed<1 ns, and the writing power consumption<~0.1 pJ/bit) and a high device durability, which is a key technology that is expected to break through the bottleneck of the power consumption of the integrated circuit in the post-Moore era. The SOT-MRAM includes a Magnetic Tunnel Junction (MTJ) for storing data and a SOT bottom electrode layer (abbreviated as bottom electrode layer) for providing a Spin Orbit Torque (SOT) for writing data.

The ferromagnetic layer in the MTJ may be of Perpendicular Magnetic Anisotropy (PMA) or In-plane Magnetic Anisotropy (IMA). For the In-plane Magnetic Anisotropy MTJ (IMA-MTJ: i-MTJ), the magnetic moment of the ferromagnetic layer switches in the in-plane directions. In order to that the ferromagnetic layer has a sufficient thermal stability, it is necessary to fabricate the MTJ into a cylindroid or a cuboid. When the device size is reduced, the i-MTJ will produce a serious marginal effect and affect the storage stability. Due to these factors, it is difficult for the lateral dimension of the i-MTJ to be less than 50 nm. In addition, the device fabrication process requirement of the i-MTJ is also higher than that of the cylindrical Perpendicular Magnetic Anisotropy MTJ (PMA-MTJ: p-MTJ), which leads to a complex fabrication process and a high cost of the i-MTJ device.

SUMMARY OF THE DISCLOSURE

An objective of the present disclosure is to provide a magnetic random-access memory, which improves the thermal stability of the i-MTJ and reduces the lateral dimension of the i-MTJ, thereby increasing the storage density of the magnetic memory.

In order to achieve the above objective, in an aspect, the present disclosure discloses a magnetic random-access memory, comprising:
an antiferromagnetic layer;
a magnetic tunnel junction disposed on the antiferromagnetic layer and comprising a ferromagnetic layer disposed corresponding to the antiferromagnetic layer;
wherein the ferromagnetic layer of the magnetic tunnel junction has in-plane magnetic anisotropy, and an exchange bias field is formed between the antiferromagnetic layer and the ferromagnetic layer by an annealing process.

Preferably, a thickness of the antiferromagnetic layer is greater than or equal to a minimum thickness required to form the exchange bias field with the ferromagnetic layer.

Preferably, the antiferromagnetic layer is a bottom electrode layer;
when electric currents in different directions are input to the bottom electrode layer to generate spin currents in different polarization directions, exchange bias fields in corresponding directions are formed between the antiferromagnetic layer and the ferromagnetic layer.

Preferably, the magnetic random-access memory further comprises a bottom electrode layer;
the bottom electrode layer is disposed at one side of the antiferromagnetic layer away from the magnetic tunnel junction;
when electric currents are input to the bottom electrode layer to generate spin currents in different polarization directions, exchange bias fields in corresponding directions are formed between the antiferromagnetic layer and the ferromagnetic layer.

Preferably, the magnetic random-access memory further comprises an interposed layer disposed between the antiferromagnetic layer and the ferromagnetic layer.

Preferably, a material of the interposed layer is one of W, Ta, Hf, Mo and Cr.

Preferably, the magnetic tunnel junction comprises a reference layer, a barrier layer and a free layer which are sequentially disposed from top to bottom, and the free layer is the ferromagnetic layer.

Preferably, the magnetic tunnel is a cylinder, a cylindroid, a cube or a cuboid.

According to the present disclosure, by disposing an antiferromagnetic layer corresponding to the ferromagnetic layer (free layer) of the i-MTJ, an exchange bias field is generated at an antiferromagnetic/ferromagnetic interface formed by the antiferromagnetic layer and the ferromagnetic layer (free layer) of the i-MTJ, thereby providing a thermal stability to the i-MTJ. Therefore, the i-MTJ of the present disclosure may be fabricated into a cylinder (or still a cylindroid while reducing an Aspect Ratio (AR) of the device). In case of the cylindroid, the AR is a ratio of a major axis length to a minor axis length of an ellipse, and in case of the cuboid, the AR is a ratio of a length to a width of a rectangle in a top view. In addition, the directions of the exchange bias field and the magnetic moment of the free layer are reversed by the SOT provided by the antiferromagnetic material itself (i.e., the antiferromagnetic material serves as the bottom electrode layer) or the bottom electrode layer adjacent thereto, so that the data can be written without a magnetic field, and the writing current is expected to be lower than the SOT writing current in the p-MTJ. Therefore, the present disclosure is expected to realize a data storage with a high speed, a high density and a low power consumption. Therefore, the present disclosure improves the thermal stability of the free layer of the i-MTJ, reduces the AR of the i-MTJ, and makes it possible to fabricate the cylindrical i-MTJ, which solves the problem that it is difficult for the lateral dimension of the i-MTJ to be less than 50 nm.

BRIEF DESCRIPTION OF THE DRAWINGS

In order to explain the technical solutions in the embodiments of the present disclosure or in the prior art more clearly, the drawings to be used in the description of the embodiments or the prior art will be briefly introduced below. Obviously, the drawings used in the following description only illustrate some embodiments of the present disclosure, and other drawings can be obtained from them by persons of ordinary skill in the art without paying a creative labor.

Figure 1A:
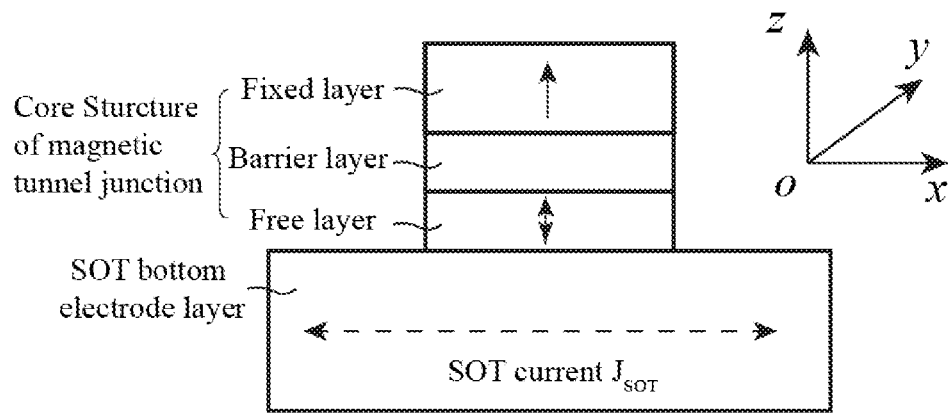
FIG. 1a to FIG. 1d illustrate schematic diagrams of a device structure of a SOT-MRAM in the prior art.

⊗ and ⊙ in the drawings represent an inward direction perpendicular to a principal plane and an outward direction perpendicular to the principal plane respectively.

DETAILED DESCRIPTION OF THE PREFERRED EMBODIMENTS

The technical solutions in the embodiments of the present disclosure will be described clearly and completely with reference to the drawings in the embodiments of the present disclosure. Obviously, those described are merely part, rather than all, of the embodiments of the present disclosure. Based on the embodiments of the present disclosure, any other embodiment obtained by persons of ordinary skill in the art without paying a creative labor should fall within the protection scope of the present disclosure.

Figure 1B:
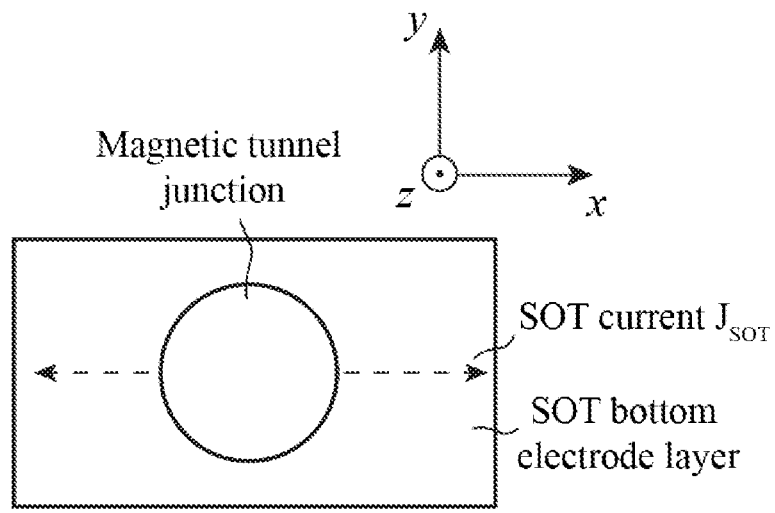
Figure 1C:
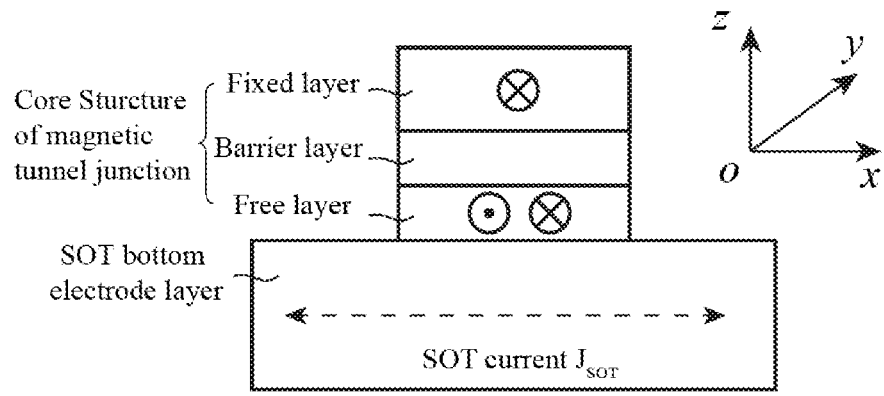

In the prior art, the Spin-Orbit Torque Magnetic Random-Access Memory (SOT-MRAM) has the advantages such as non-volatility, data writing of a high speed and a low power consumption, and a high device durability. The core structure of the SOT-MRAM is illustrated in FIG. 1a or FIG. 1c, and the SOT-MRAM mainly includes a magnetic tunnel junction MTJ for storing data and a bottom electrode layer for providing a Spin Orbit Torque (SOT) for writing data, wherein the core structure of the MTJ includes a reference layer composed of ferromagnetic metal, a barrier layer composed of oxide and a free layer composed of ferromagnetic metal, and wherein a magnetic moment direction of the free layer may be changed by an external excitation, so as to switch in two directions of an easy magnetization axis, while a magnetic moment direction of a fixed layer will not be easily changed by the external excitation, so as to be fixed in a certain direction. When the magnetic moment direction of the free layer is parallel to that of the fixed layer, the MTJ exhibits a low resistance, and when the magnetic moment direction of the free layer is antiparallel to that of the fixed layer, the MTJ exhibits a high resistance, so that a high resistance state or a low resistance state of the MTJ can correspond to logic data '1' and '0' respectively, thereby storing corresponding data '1' and '0'.

Figure 1D:
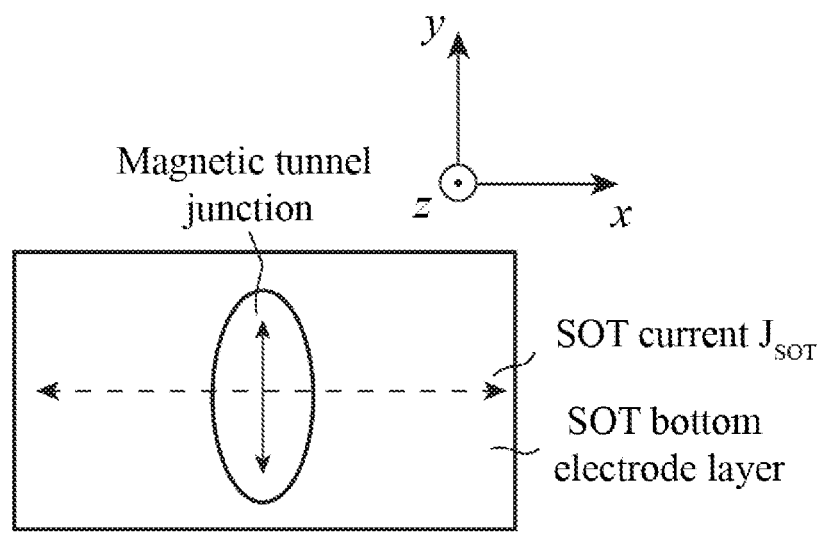

The free layer in the MTJ may be of Perpendicular Magnetic Anisotropy (PMA) or In-plane Magnetic Anisotropy (IMA). As illustrated in FIG. 1a, when the free layer has the PMA, the magnetic moment of the free layer switches in the vertical direction, i.e., direction ±z. At this time, since the thermal stability of the free layer is provided by the PMA, the MTJ may be fabricated into a cylinder, and a top view of a corresponding SOT device is illustrated in FIG. 1b. When the free layer has the IMA, as illustrated in FIG. 1c, the magnetic moment of the free layer switches in the in-plane direction, i.e., direction ±y in FIG. 1c. However, in order that the free layer has a sufficient thermal stability at this time, it is necessary to fabricate the MTJ into a shape such as a cylindroid or a cuboid. FIG. 1d illustrates a top view of a SOT device when the MTJ is a cylindroid, and the easy magnetization axis of the magnetic moment of the free layer is a long axis of an ellipse. In order to ensure the thermal stability of the MTJ, an Aspect Ratio (AR) of the ellipse or the cuboid should reach 3 to 4, which makes it difficult for the lateral dimension of the i-MTJ to be less than 50 nm. Meanwhile, with the reduction of the device size, the i-MTJ will produce a serious marginal effect and affect the storage stability. In addition, the device fabrication process of the i-MTJ also precedes the Perpendicular Magnetic Anisotropy MTJ (PMA-MTJ: p-MTJ) of the cylindroid. Due to the above disadvantages, the current academic and industrial researches are focused on the p-MTJ.

However, there are two obvious problems in reversing the direction of the magnetic moment of the free layer of the p-MTJ by means of the SOT: (1) an in-plane magnetic field is needed to break through the symmetry of the SOT and realize the decisive reversal of the magnetic moment, and this need seriously hinders the integration and the practical application of the SOT device. Although there have been many solutions to solve this problem at present, it is often necessary to introduce new materials or additional operations, while if the SOT is adopted to write data into the i-MTJ, an assistance of an external magnetic field is not needed. (2) The writing current density of this way is still very high. For example, the p-MTJ reported by the IMEC at the IEEE VLSI Conference in 2019 has a SOT writing current density of 126 MA·cm$^{-2}$ at a writing speed of 1 ns. In contrast, the i-MTJ reported by Tohoku University of Japan at the IEEE IEDM Conference in 2019 only requires a SOT writing current density of 23.6 MA·cm$^{-2}$ at a writing speed of 1 ns, and this writing current density is less than ⅕ of that of the p-MTJ. Therefore, the i-MTJ is more advantageous from the perspective of the SOT without a magnetic field reversal and the data writing of a low power consumption.

Therefore, in order to improve the thermal stability of the free layer of the i-MTJ, reduce the AR of the i-MTJ, solve the problem that it is difficult for the lateral dimension of the i-MTJ to be less than 50 nm, and make it possible to fabricate the cylindrical i-MTJ, the present disclosure sets an antiferromagnetic layer corresponding to the ferromagnetic layer (free layer) of the i-MTJ, so that an exchange bias field is generated at an antiferromagnetic/ferromagnetic interface formed by the antiferromagnetic layer and the ferromagnetic layer (free layer) of the i-MTJ, thereby providing a thermal stability to the i-MTJ. Therefore, the i-MTJ of the present disclosure may be fabricated into a cylinder (or still a cylindroid while reducing the AR). In addition, the directions of the exchange bias field and the magnetic moment of the free layer are reversed by the SOT provided by the antiferromagnetic material itself (i.e., the antiferromagnetic material serves as the bottom electrode layer) or the bottom electrode layer adjacent thereto, so that the data can be written without a magnetic field, and the writing current is expected to be lower than the SOT writing current in the p-MTJ. Therefore, the present disclosure is expected to realize a data storage with a high speed, a high density and a low power consumption.

Figure 2A:
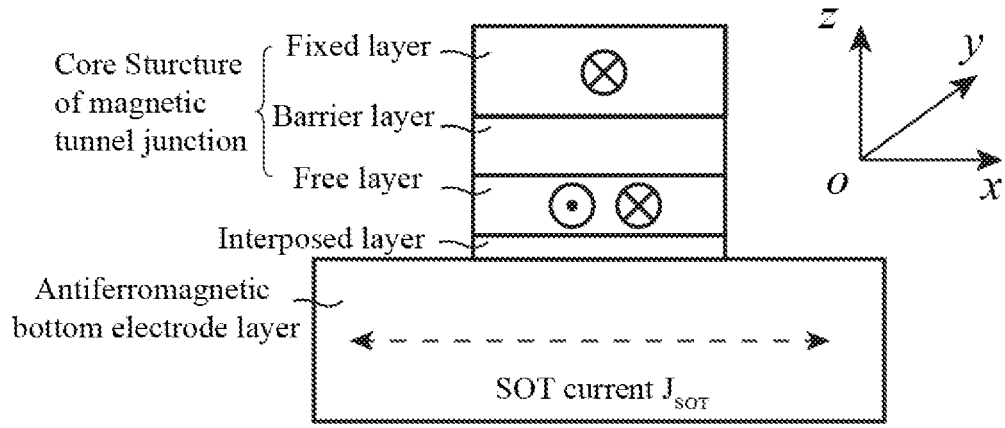
FIG. 2a to FIG. 2d illustrate schematic diagrams of a device structure of a SOT-MRAM in the present disclosure.
Figure 2B:
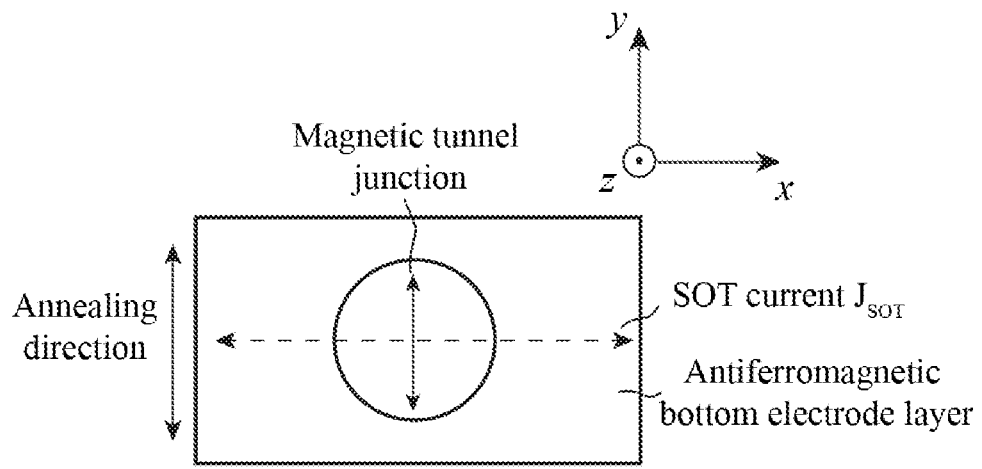

On this basis, according to an aspect of the present disclosure, this embodiment discloses a magnetic random-access memory. As illustrated in FIG. 2a and FIG. 2b, in this embodiment, the magnetic random-access memory comprises: an antiferromagnetic layer, and a magnetic tunnel junction disposed on the antiferromagnetic layer and comprising a ferromagnetic layer (free layer) disposed corresponding to the antiferromagnetic layer, wherein the ferromagnetic layer of the magnetic tunnel junction has in-plane magnetic anisotropy, and an exchange bias field is formed between the antiferromagnetic layer and the ferromagnetic layer by an annealing process.

It should be noted that for the magnetic random-access memory illustrated in FIG. 2a, when the exchange bias field is formed by in-plane annealing, an annealing direction may be any direction except direction ±x in an xoy plane, such as direction ±y, as illustrated in FIG. 2b, and the annealing direction may be set by persons skilled in the art based on the actual situation.

According to the present disclosure, by disposing an antiferromagnetic layer corresponding to the ferromagnetic layer (free layer) of the i-MTJ, an exchange bias field is generated at an antiferromagnetic/ferromagnetic interface formed by the antiferromagnetic layer and the ferromagnetic layer (free layer) of the i-MTJ, thereby providing a thermal stability to the i-MTJ. Therefore, the i-MTJ of the present disclosure may be fabricated into a cylinder (or still a cylindroid while reducing the AR). In addition, the directions of the exchange bias field and the magnetic moment of the free layer are reversed by the SOT provided by the antiferromagnetic material itself (i.e., the antiferromagnetic material serves as the bottom electrode layer) or the bottom electrode layer adjacent thereto, so that the data can be written without a magnetic field, and the writing current is expected to be lower than the SOT writing current in the p-MTJ. Therefore, the present disclosure is expected to realize a data storage with a high speed, a high density and a low power consumption. Therefore, the present disclosure is expected to realize data storage with high speed, high density and low power consumption. Therefore, the present disclosure improves the thermal stability of the free layer of the i-MTJ, reduces the AR of the i-MTJ, and makes it possible to fabricate the cylindrical i-MTJ, which solves the problem that it is difficult for the lateral dimension of the i-MTJ to be less than 50 nm, thereby reducing the lateral dimension of the i-MTJ and improving the storage density of the magnetic memory.

In a preferred embodiment, the magnetic tunnel junction comprises a reference layer, a barrier layer and a free layer which are sequentially disposed from top to bottom, and the free layer is the ferromagnetic layer, wherein a magnetic moment direction of the reference layer is fixed, while a magnetic moment direction of the free layer changes under an action of the bias exchange field. The magnetic moment direction of the free layer may be changed by controlling the direction of the bias exchange field, so that the magnetic moment direction of the free layer is the same as or opposite to that of the reference layer, and a resistance state of the magnetic tunnel junction is a low resistance state or a high impedance state.

Figure 3:
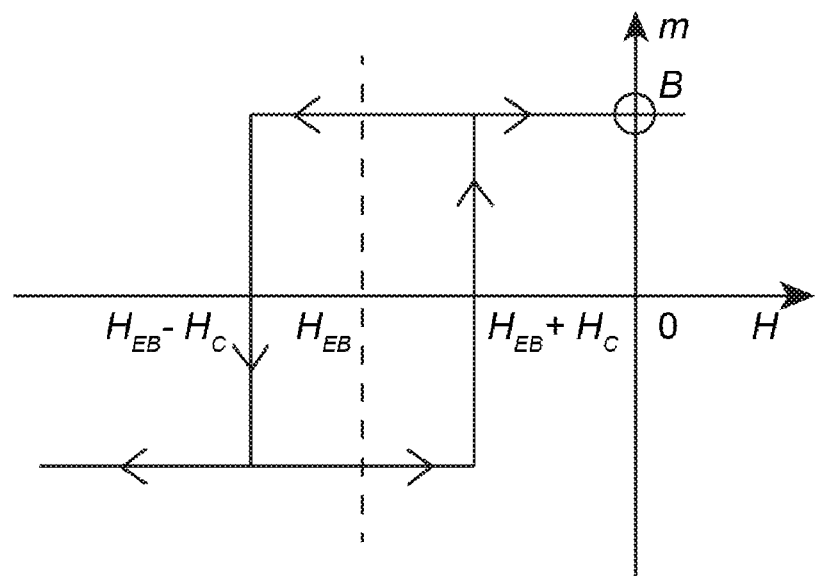
FIG. 3 and FIG. 4 illustrate schematic diagrams of a hysteresis loop of a magnetic tunnel junction free layer of a SOT-MRAM in the present disclosure.
Figure 4:
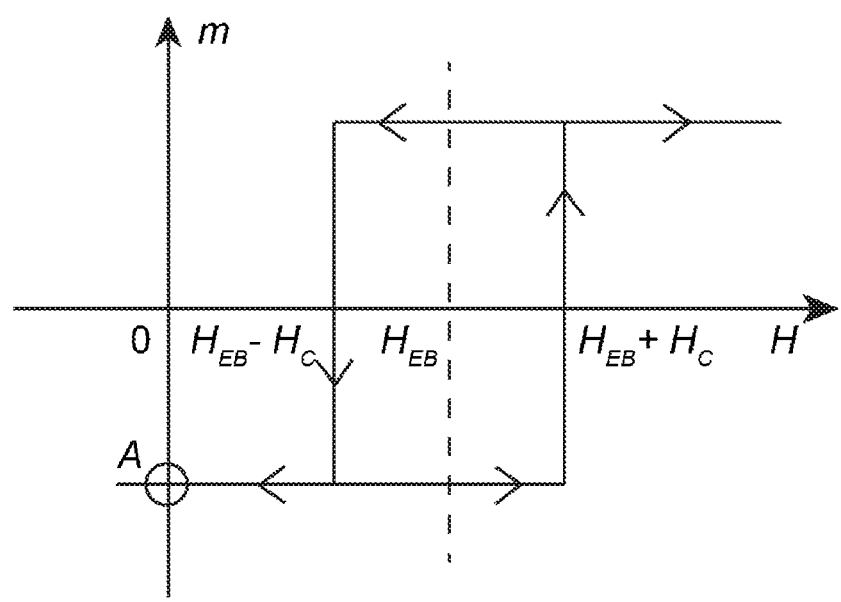

In a preferred embodiment, a thickness of the antiferromagnetic layer is greater than or equal to a minimum thickness required to form an exchange bias field with the ferromagnetic layer. Specifically, it can be understood that when the thickness of the antiferromagnetic layer is greater than or equal to the minimum thickness (critical thickness) for providing the exchange bias field, the exchange bias field keeps a stable magnetic moment direction of the ferromagnetic layer if there is no influence such as an external magnetic field. When electric currents in different directions are input to the bottom electrode layer to change the direction of the exchange bias field, so that the hysteresis loop of the ferromagnetic layer becomes as illustrated in FIG. 3 or FIG. 4, then the magnetic moment direction of the ferromagnetic layer is kept at point B or point A, i.e., two directions with opposite magnetic moments. At this time, only when an external disturbance exceeds the exchange bias field $H_{EB}$, it is possible to change the magnetic moment direction of the ferromagnetic layer and cause an information loss. Thus, the thermal stability of the magnetic random-access memory in the present disclosure is determined by the exchange bias field. By increasing the exchange bias field, the thermal stability of the magnetic random-access memory can be improved, so that the magnetic tunnel junction of the cylinder (or still a cylindroid while reducing the AR) also has a strong thermal stability, and information is not easy to be lost. Combined with the advantages of the i-MTJ of data writing of a high speed and a low power consumption and without a magnetic field, the present disclosure is expected to realize a data storage of a high-speed, a high density and a low power consumption. The magnetic tunnel junction does not need to be made into a cylindroid, which makes it possible to fabricate a cylindrical i-MTJ, and also solves the problem that it is difficult for the lateral dimension of the i-MTJ to be less than 50 nm.

Since the thermal stability of the magnetic random-access memory is determined by the magnetic field strength of the exchange bias field, it is preferable that the exchange bias field $H_{EB}$ formed by the antiferromagnetic layer and the ferromagnetic layer is stronger than a coercive field Hc formed, thereby further ensuring that the whole hysteresis loop of the ferromagnetic layer is completely located on a side of H>0 or H<0 in a undisturbed state, and improving the anti-interference performance of the ferromagnetic layer.

In an optional embodiment, the antiferromagnetic layer is a bottom electrode layer. When electric currents in different directions are input to the bottom electrode layer, exchange bias fields in corresponding directions are formed between the antiferromagnetic layer and the ferromagnetic layer by an annealing process.

It can be understood that the antiferromagnetic layer may serve as the bottom electrode layer. By inputting the SOT current to the antiferromagnetic layer and controlling different directions of the SOT current, exchange bias fields in different directions may be provided to the magnetic tunnel junction, so that the magnetic moment of the ferromagnetic layer is kept in different directions, thereby realizing data writing. However, when the magnetic moment is kept in a certain direction, the corresponding exchange bias field can ensure the thermal stability of the i-MTJ.

Figure 2C:
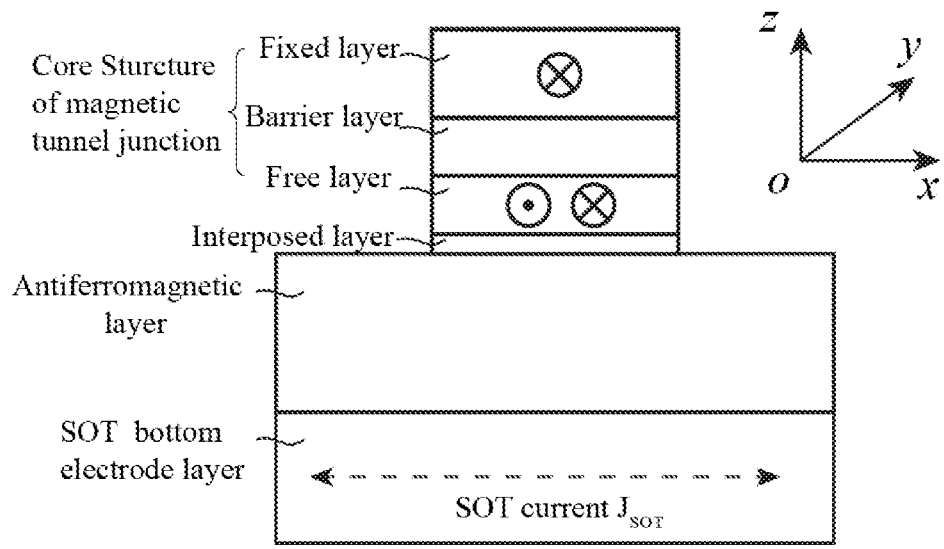
Figure 2D:
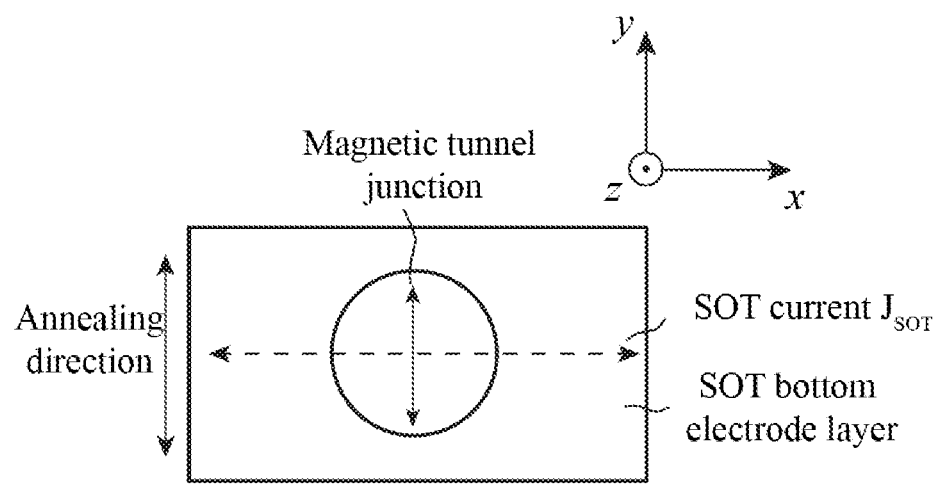

In another optional embodiment, the antiferromagnetic layer is not taken as the bottom electrode layer, and the magnetic random-access memory further comprises a bottom electrode layer, as illustrated in FIG. 2c and FIG. 2d. The bottom electrode layer is disposed on a side of the antiferromagnetic layer away from the magnetic tunnel junction, and when electric currents in different directions are input to the bottom electrode layer to generate spin currents in different polarization directions, exchange bias fields in corresponding directions are formed between the antiferromagnetic layer and the ferromagnetic layer. Preferably, the thickness of the bottom electrode layer is selected from a range of 1 to 100 nm.

It can be understood that the antiferromagnetic layer may not serve as the bottom electrode layer, and the magnetic random-access memory may further comprise a bottom electrode layer. By inputting electric currents to the bottom electrode layer to control the polarization directions of the generated spin currents, exchange bias fields in different directions can be provided to the free layer (ferromagnetic layer) of the magnetic tunnel junction, thereby keeping the magnetic moment of the ferromagnetic layer in different directions and realizing data writing. However, when the magnetic moment is kept in a certain direction, the corresponding exchange bias field can ensure the thermal stability of the i-MTJ.

In a preferred embodiment, the magnetic random-access memory further comprises an interposed layer between the antiferromagnetic layer and the ferromagnetic layer, as illustrated in FIG. 2a and FIG. 2c. It can be understood that a very thin interposed layer may be interposed between the ferromagnetic layer and the antiferromagnetic layer, which can enhance the interfacial anisotropy of the free layer (but the free layer is still in-plane anisotropic), reduce the SOT reversal current density, and suppress the antiferromagnetic element diffusion, wherein the thickness of the interposed layer needs to be extremely thin, and preferably is 0 to 1 nm.

In a preferred embodiment, the magnetic tunnel junction has a shape such as a cylinder, a cylindroid, a cube or a cuboid. It can be understood that in the present disclosure, an exchange bias field is formed at an interface between the antiferromagnetic layer and the ferromagnetic layer serving as the free layer, which improves the thermal stability of the free layer of the magnetic tunnel junction, so that the i-MTJ can adopt a cylindrical shape to further reduce the lateral dimension of the i-MTJ and improve the storage density of the magnetic memory. Of course, the magnetic tunnel junction may also adopt any other shape such as a cylindroid, a cube, or a cuboid, which is not limited herein.

In a preferred embodiment, the free layer of the magnetic tunnel junction for example may be made of a CoFeB alloy having a common element ratio such as $Co_{20}Fe_{60}B_{20}$, $Co_{40}Fe_{40}B_{20}$ or $Co_{60}Fe_{20}B_{20}$; or a CoFe alloy having a common element ratio such as $Co_{25}Fe_{75}$ or $Co_{75}Fe_{25}$; or a combination of the CoFeB alloy and the CoFe alloy, and for example, the 1.9 nm free layer of the magnetic tunnel junction is made of the 0.3 nm CoFe alloy and the 1.6 nm CoFeB alloy. In the practical application, the ratio of each element in the alloy is not limited, and the ratio of each alloy in different alloy combinations is also not limited, which can be flexibly determined based on the actual situation. The material is not limited to those listed above, and the technical solution of forming the magnetic random-access memory by using the material capable of realizing the function of the free layer should also fall within the protection scope of the present disclosure.

In a preferred embodiment, a material of the barrier layer of the magnetic tunnel junction may be a metal oxide, such as magnesium oxide or aluminum oxide. In the practical application, the material of the barrier layer is not limited, and can be flexibly determined based on the actual situation. The material is also not limited to those listed above, and the technical solution of forming the magnetic random-access memory by using the material capable of realizing the function of the barrier layer should also fall within the protection scope of the present disclosure.

In a preferred embodiment, the fixed layer of the magnetic tunnel junction for example may be made of a CoFeB alloy having a common element ratio such as $Co_{20}Fe_{60}B_{20}$, $Co_{40}Fe_{40}B_{20}$ or $Co_{60}Fe_{20}B_{20}$; a CoFe alloy having a common element ratio such as $Co_{25}Fe_{75}$ or $Co_{75}Fe_{25}$; or a combination of the CoFeB alloy and the CoFe alloy, and for example, the 1.9 nm free layer of the magnetic tunnel junction is made of the 0.3 nm CoFe alloy and the 1.6 nm CoFeB alloy. In the practical application, the ratio of each element in the alloy is not limited, and the ratio of each alloy in different alloy combinations is also not limited, which can be flexibly determined based on the actual situation. The material is not limited to those listed above, and the technical solution of forming the magnetic random-access memory by using the material capable of realizing the function of the free layer should also fall within the protection scope of the present disclosure. More preferably, the magnetic random-access memory further comprises a synthetic antiferromagnetic or antiferromagnetic material formed above the fixed layer, so that the magnetic moment direction of the fixed layer can be fixed by the synthetic antiferromagnetic or antiferromagnetic material, and the magnetic moment direction of the fixed layer remains unchanged.

In a preferred embodiment, the antiferromagnetic layer may be made of at least one of IrMn, FeMn, PtMn, GdFeCo, etc. In the practical application, the ratio of each element in each material is not limited. For example, the antiferromagnetic IrMn may be IrMn or $IrMn_3$, and the material ratio can be flexibly determined based on the actual situation. The material is also not limited to those listed above, and the technical solution of forming the magnetic random-access memory by using the material capable of realizing the function of the antiferromagnetic layer should also fall within the protection scope of the present disclosure.

In a preferred embodiment, the interposed layer may be made of at least one of W, Ta, Hf, Mo, Cr, etc. In the practical application, the material of the interposed layer is not limited to those listed above, and the technical solution of forming the magnetic random-access memory by using the material capable of realizing the function of the interposed layer should also fall within the protection scope of the present disclosure.

In a preferred embodiment, when the magnetic random-access memory further comprises a bottom electrode layer, the bottom electrode layer may be made of a heavy metal material such as W, Pt, Ta and Ir, a ferromagnetic material such as FePt, CoFe and Co, a multilayer film material such as $[Pt/Hf]_n$ and $[Pt/Co]_n$ (n is a repetition number of a structure of a basic film layer, n≥1), an alloy material such as $Pt_xAu_{1-x}$ and $Au_xTa_{1-x}$, a topological material such as $Bi_xSe_{1-x}$, $Bi_xTe_{1-x}$, $Bi_xSb_{1-x}$, $W_xTe_{1-x}$ and $Mo_xTe_{1-x}$, wherein x is an element ratio valued from 0 to 1.

The present disclosure will be further explained below through several specific examples.

Embodiment 1

Figure 5A:
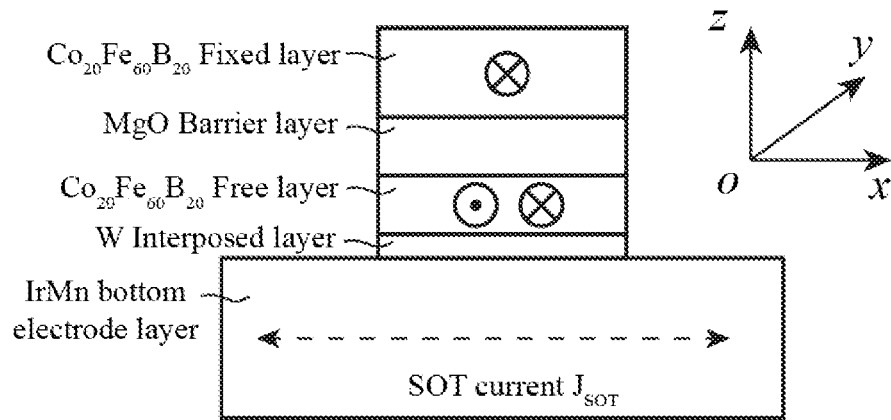
FIG. 5a and FIG. 5b illustrate schematic diagrams of a device structure of a SOT-MRAM in Embodiment 1 of the present disclosure.
Figure 5B:
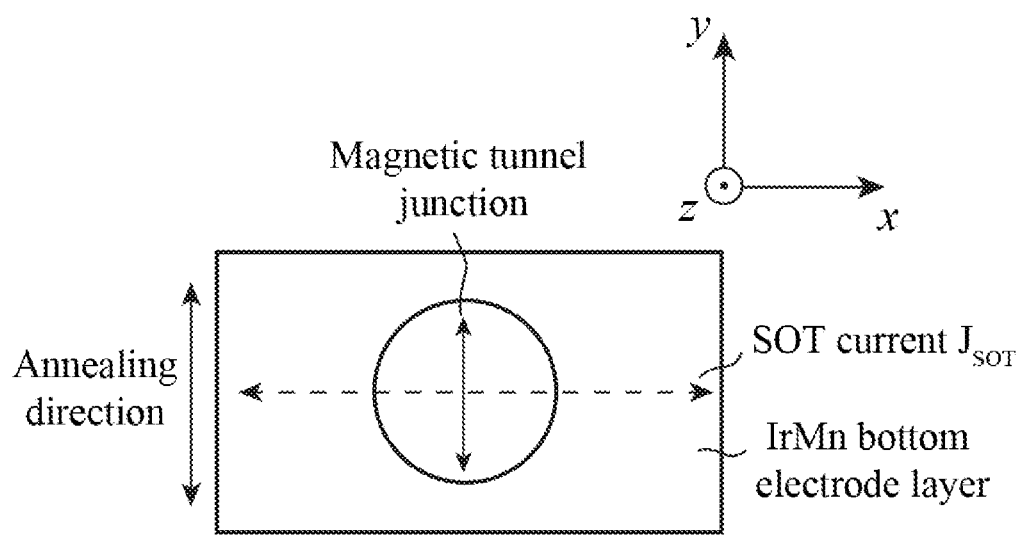

As illustrated in FIG. 5a and FIG. 5b, in this specific example, an in-plane magnetic anisotropic spin orbit torque device is composed of an IrMn bottom electrode layer of 8 nm, a W interposed layer of 0.5 nm and an i-MTJ with a core structure of $Co_{20}Fe_{60}B_{20}/MgO/Co_{20}Fe_{60}B_{20}$. By in-plane magnetic field annealing in direction +y or −y, an easy magnetization direction of the magnetic moment of the free layer is direction ±y, and a shape of the magnetic tunnel junction is cylindrical. The directions of the exchange bias field and the magnetic moment of the free layer can be reversed by introducing electric currents into the IrMn.

Embodiment 2

Figure 6A:
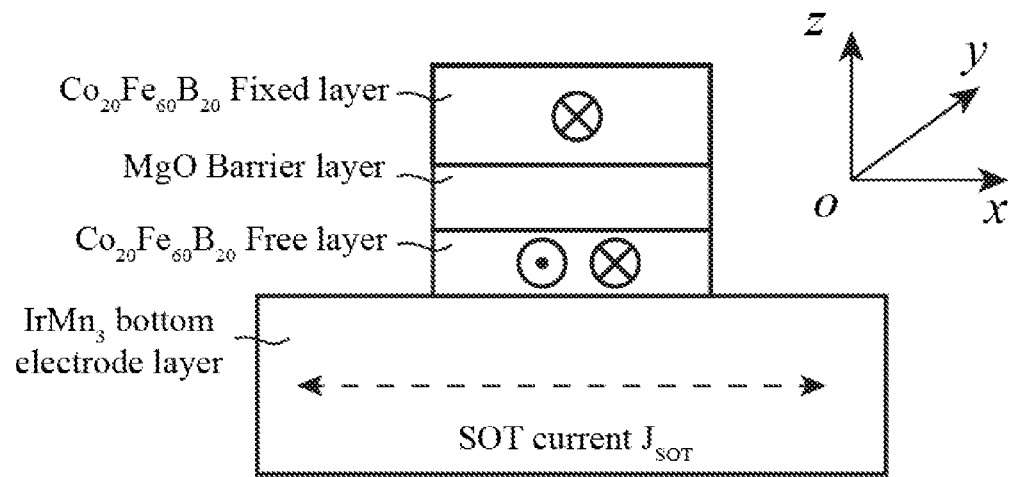
FIG. 6a and FIG. 6b illustrate schematic diagrams of a device structure of a SOT-MRAM in Embodiment 2 of the present disclosure.
Figure 6B:
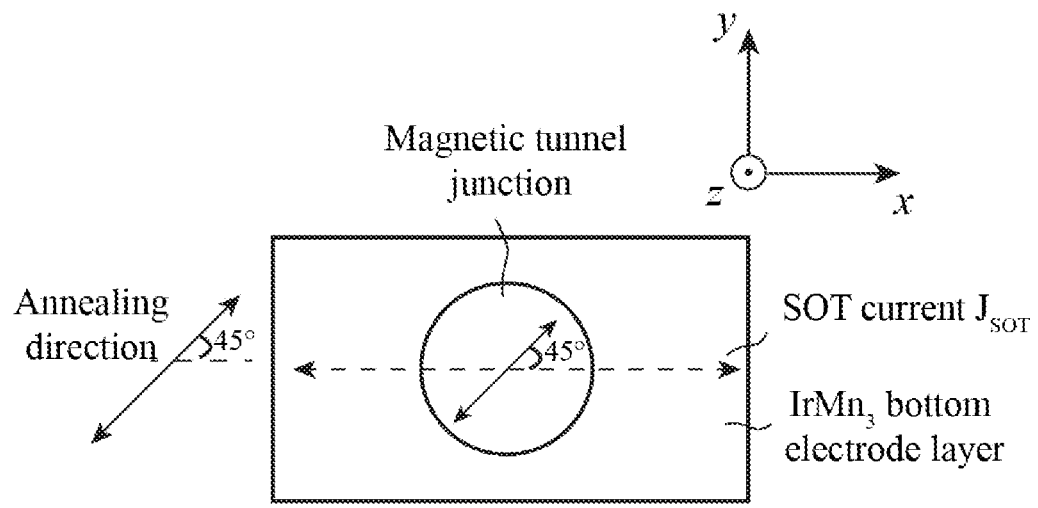

As illustrated in FIG. 6a and FIG. 6b, in this specific example, an in-plane magnetic anisotropic spin orbit torque device is composed of an $IrMn_3$ bottom electrode layer of 6 nm and an i-MTJ with a core structure of $Co_{20}Fe_{60}B_{20}/MgO/Co_{20}Fe_{60}B_{20}$. An annealing direction of an in-plane magnetic field is at an angle of 45° with the direction +x or −x, an easy magnetization direction of the magnetic moment of the free layer is at an angle of 45° or 135° with an axis +x, and a shape of the magnetic tunnel junction is cylindrical. The directions of the exchange bias field and the magnetic moment of the free layer can be reversed by introducing electric currents into the $IrMn_3$.

Embodiment 3

Figure 7A:
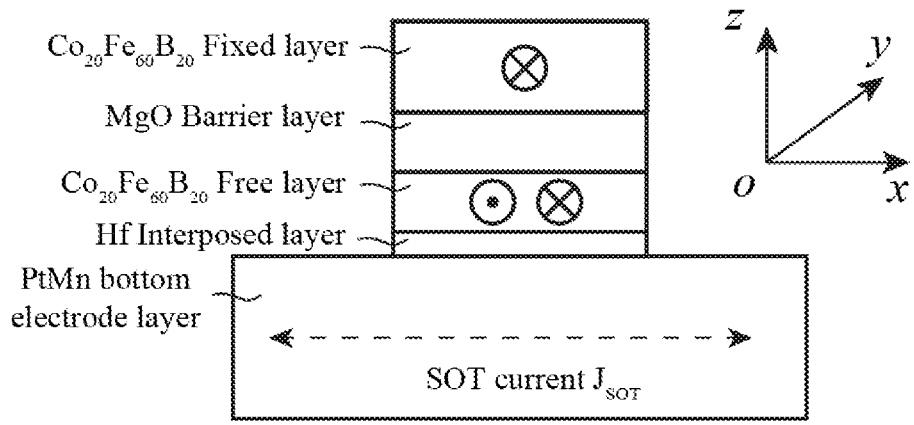
FIG. 7a and FIG. 7b illustrate schematic diagrams of a device structure of a SOT-MRAM in Embodiment 3 of the present disclosure.
Figure 7B:
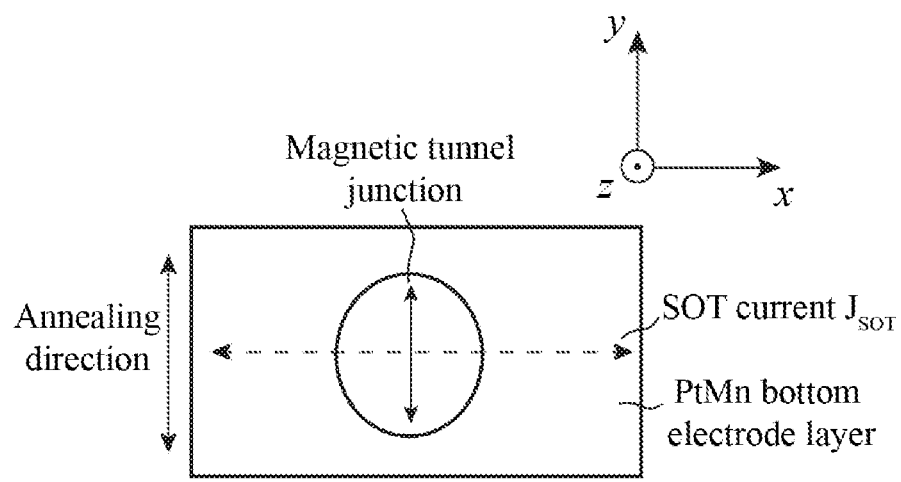

As illustrated in FIG. 7a and FIG. 7b, in this specific example, an in-plane magnetic anisotropic spin orbit torque device is composed of a PtMn bottom electrode layer of 8 nm, an Hf interposed layer of 0.4 nm, and an i-MTJ with a core structure of $Co_{20}Fe_{60}B_{20}/MgO/Co_{20}Fe_{60}B_{20}$. By in-plane magnetic field annealing in direction +y or −y, an easy magnetization direction of the magnetic moment of the free layer is direction ±y. An exchange bias field formed at an antiferromagnetic/ferromagnetic interface improves the thermal stability of the free layer, thereby reducing the demand of the i-MTJ for the AR. A shape of the magnetic tunnel junction is a cylindroid, but the AR is only slightly larger than 1. The directions of the exchange bias field and the magnetic moment of free layer can be reversed by introducing electric currents into the PtMn.

Embodiment 4

Figure 8A:
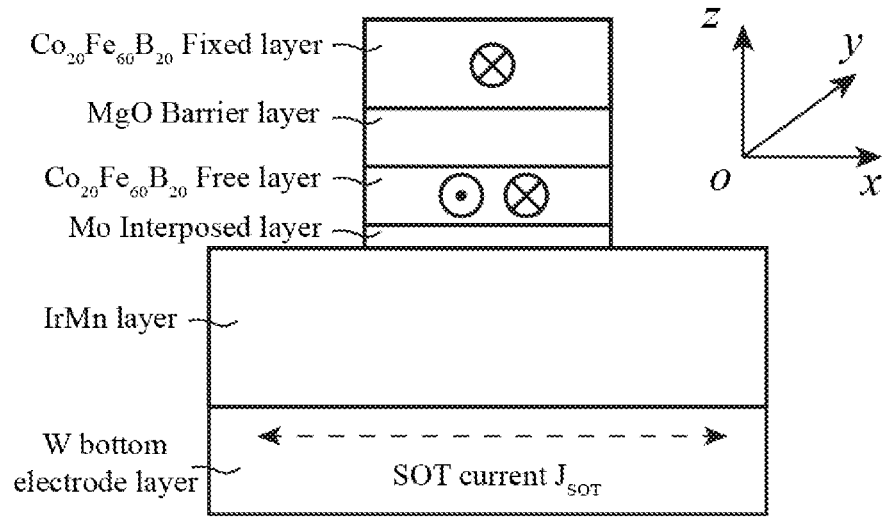
FIG. 8a and FIG. 8b illustrate schematic diagrams of a device structure of a SOT-MRAM in Embodiment 4 of the present disclosure.
Figure 8B:
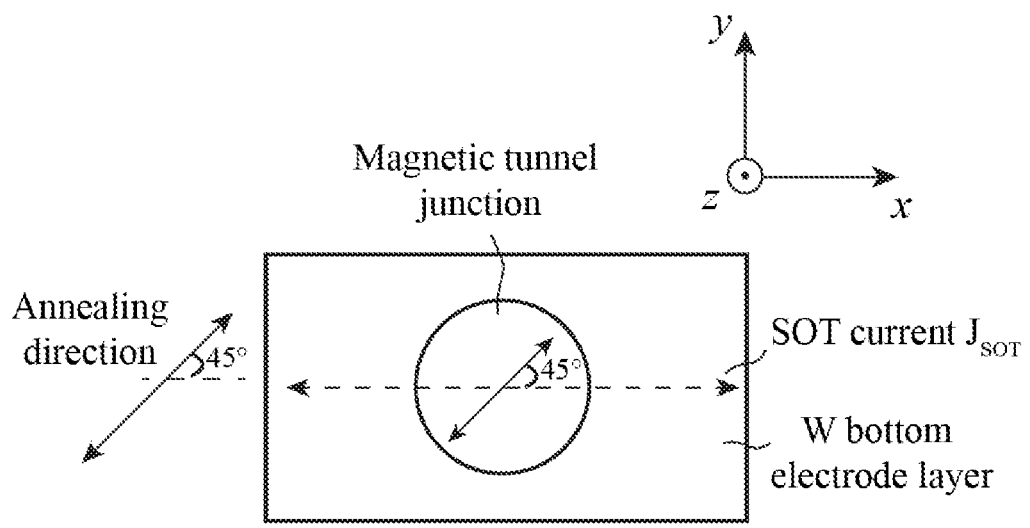

As illustrated in FIG. 8a and FIG. 8b, in this specific example, an in-plane magnetic anisotropic spin orbit torque device is composed of a W bottom electrode layer of 5 nm, an IrMn layer of 6 nm, a Mo interposed layer of 0.3 nm, and an i-MTJ with a core structure of $Co_{20}Fe_{60}B_{20}/MgO/Co_{20}Fe_{60}B_{20}$. An annealing direction of an in-plane magnetic field is at an angle of 45° with the direction +x or −x, an easy magnetization direction of the magnetic moment of the free layer is at an angle of 45° or 135° with an axis +x, and a shape of the magnetic tunnel junction is cylindrical. The directions of the exchange bias field and the magnetic moment of the free layer are reversed by introducing electric currents into the metal W.

The embodiments herein are described in a progressive manner, and the same or similar parts of the embodiments can refer to each other. Each embodiment lays an emphasis on its distinctions from other embodiments. In particular, the system embodiment is simply described since it is substantially similar to the method embodiment, and please refer to the descriptions of the method embodiment for the relevant part.

Those described above are just specific embodiments of the present disclosure, and are not intended to limit the present disclosure. For persons skilled in the art, various modifications and variations can be made to the present application. Any modification, equivalent replacement, improvement, etc. made within the spirit and principle of the present disclosure should fall within the scope of the claims of the present disclosure.

What is claimed is:

1. A magnetic random-access memory, comprising:
   an antiferromagnetic layer;
   a magnetic tunnel junction disposed on the antiferromagnetic layer and comprising a ferromagnetic layer disposed corresponding to the antiferromagnetic layer;
   wherein the ferromagnetic layer of the magnetic tunnel junction has in-plane magnetic anisotropy, and an exchange bias field is formed between the antiferromagnetic layer and the ferromagnetic layer;
   the magnetic random-access memory further comprises a bottom electrode layer, wherein the bottom electrode layer is the antiferromagnetic layer or an additional electrode layer disposed at one side of the antiferromagnetic layer away from the magnetic tunnel junction;
   when electric currents in different directions are input to the bottom electrode layer to generate spin currents in different polarization directions, exchange bias fields in corresponding directions are formed between the antiferromagnetic layer and the ferromagnetic layer;
   the exchange bias field formed by the antiferromagnetic layer and the ferromagnetic layer is stronger than a coercive field formed;
   the whole hysteresis loop of the ferromagnetic layer is completely located on a side of H>0 or H<0 in a undisturbed state, and the exchange bias field plus the coercive field is less than 0 or the exchange bias field minus the coercive field is larger than 0;
   the direction of exchange bias fields at the interface of antiferromagnet and ferromagnet is controlled by applying currents into the bottom electrode layer.

2. The magnetic random-access memory according to claim 1, wherein a thickness of the antiferromagnetic layer is greater than or equal to a minimum thickness required to form the exchange bias field with the ferromagnetic layer.

3. The magnetic random-access memory of claim 1, further comprising an interposed layer disposed between the antiferromagnetic layer and the ferromagnetic layer.

4. The magnetic random-access memory according to claim 3, wherein a material of the interposed layer is one of W, Ta, Hf, Mo and Cr.

5. The magnetic random-access memory according to claim 1, wherein the magnetic tunnel junction comprises a reference layer, a barrier layer and a free layer which are sequentially disposed from top to bottom, and the free layer is the ferromagnetic layer.

6. The magnetic random-access memory according to claim 1, wherein the magnetic tunnel is a cylinder, a cylindroid, a cube or a cuboid.

* * * * *